United States Patent [19]
Groat et al.

[11] Patent Number: 5,911,825
[45] Date of Patent: Jun. 15, 1999

[54] LOW OXYGEN HEATER

[75] Inventors: Clifford W. Groat; Atsushi Iwasaki, both of Vancouver, Wash.

[73] Assignee: SEH America, Inc., Vancouver, Wash.

[21] Appl. No.: 08/941,534

[22] Filed: Sep. 30, 1997

[51] Int. Cl.$^6$ .................................................. C30B 35/00
[52] U.S. Cl. ........................ 117/200; 117/217; 117/222
[58] Field of Search .................................. 117/200, 217, 117/222

[56] References Cited

U.S. PATENT DOCUMENTS

| | | | |
|---|---|---|---|
| 2,998,335 | 8/1961 | Dehmelt | 117/22 |
| 3,359,077 | 12/1967 | Arst | 117/30 |
| 3,953,281 | 4/1976 | Pantusco et al. | 117/218 |
| 4,040,895 | 8/1977 | Patrick et al. | 117/20 |
| 4,239,585 | 12/1980 | Köhl | 117/20 |
| 4,511,428 | 4/1985 | Ghosh et al. | 117/15 |
| 5,462,011 | 10/1995 | Tomzig et al. | 117/217 |
| 5,578,123 | 11/1996 | Vilzmann et al. | 117/222 |
| 5,660,752 | 8/1997 | Vilzmann | 219/55 |
| 5,766,347 | 6/1998 | Shimomura et al. | 117/217 |

FOREIGN PATENT DOCUMENTS

| 3-57072 | 8/1991 | Japan . |
|---|---|---|
| 4-305087 | 10/1992 | Japan . |

*Primary Examiner*—Felisa Garrett
*Attorney, Agent, or Firm*—Kolisch, Hartwell, Dickinson, McCormack & Heuser

[57] ABSTRACT

A heater is configured to reduce oxygen in the melt near the growing crystal is provided by defining a high temperature region in an upper region of the heater, above a melt surface of semiconductor material from which a crystal is grown. This effectively shifts the heat balance of the system upwards, and alters thermal convections of oxygen within the melt. Accordingly, the primary vehicle for transporting oxygen to the growing crystal is suppressed.

16 Claims, 2 Drawing Sheets

LOW OXYGEN HEATER

TECHNICAL FIELD

The present invention relates generally to the growing of crystals, and more particularly, to a heater for use in heating a material from which such crystals are grown. The heater defines a predetermined high temperature region which reduces available oxygen near the growing crystal, thereby diminishing the concentration of oxygen within the growing crystal.

BACKGROUND

One well-known method of growing crystals, the Czochralski method, involves dipping a crystal seed into a quantity of semiconductor material, and withdrawing the seed slowly so as to produce a resultant crystal of predetermined shape and size. The semiconductor material is kept in a quartz crucible, and typically is heated by an onboard heater so as to bring the material to a molten state. Temperature of the melt is critical, such temperature being determinative of the resultant crystal's shape and size.

Another important factor to the crystal-growing process is the oxygen content of the resultant crystal, particularly where the crystal is formed of a material such as silicon. It will be appreciated, for example, that dissolution of silica ($SiO_2$) during crystal growth introduces significant amounts of oxygen into the melt and thus into the growing crystal. Although traditional applications allow for relatively high amounts of oxygen in the crystal without ill effect, many current semiconductor applications call for crystals which have lower oxygen concentrations. Accordingly, it would be desirable to provide an system whereby the oxygen concentration of grown crystals may be controlled.

As will be appreciated by those skilled in the art, the amount of oxygen in a crystal grown by the Czochralski method is determined by the natural thermal convection of oxygen to the melt surface, and by the thermal characteristics of the heater which heats the melt. It will be noted, for example, that a conventional heater defines an elongate heat zone which surrounds the crucible to uniformly heat the melt. This tends to direct oxygen toward the melt surface, and thus tends to increase oxygen in the growing crystal, which is drawn from the surface of the melt. The present invention arises from recognition of the benefit of shifting the heat balance of the system's heater so as to suppress the natural thermal melt convections which transport oxygen without significantly detracting from the heater's ability to control the temperature of the melt.

DISCLOSURE OF THE INVENTION

The aforementioned goals and objectives are met by provision of a crystal growing system which employs a heater having a first heater region wherein the heater is configured to melt material for growing a crystal, and a second heater region wherein the heater is configured to draw oxygen away from the growing crystal. Typically, second heater region is a high temperature region positioned in an upper portion of the heater, above the first heater region where semiconductor material is melted and crystal is grown. This effectively shifts the heat balance of the system upwards, and thus alters the thermal melt convections. Accordingly, the primary vehicle for transporting oxygen to a growing crystal is suppressed.

The heater is formed from an elongate conductive heating element having a resistance which varies along its length to provide for definition of a first heater region wherein the element has a first resistance, and a second heater region wherein the element has a second resistance which is greater than the first resistance. In one embodiment, the heating element takes the form of a conductive filament such as a wire or the like. Upon applying power to the filament, the first heater region is heated to a first temperature, and the second heater region is heated to a second temperature which is greater than the first temperature. The second heater region thus may serve as a high temperature region whereby oxygen transportation to the crystal during growth is reduced.

In one embodiment, the filament is folded back and forth on itself to define a cylinder which surrounds the semiconductor material. The filament thus defines an elongate first heater region with spaced, longitudinal pickets, and an elongate second heater region with generally U-shaped return bends. The filament is of relatively uniform cross sectional area in the first heater region, but lesser cross sectional area in the second heater region. Accordingly, the pickets define relatively uniform longitudinal slots in the first heater region. However, the slots widen in the second heater region, and correspondingly, increasing the filament's resistance and temperature in the second heater region. The slots typically widen in a generally teardrop shape so as to dissipate mechanical stress of the filament, and thereby prolong the heater's life.

These and other objects and advantages of the present invention will be more readily understood after a consideration of the drawings and the detailed description of the preferred embodiment which follows.

DETAILED DESCRIPTION OF THE PREFERRED EMBODIMENT AND BEST MODE OF CARRYING OUT THE INVENTION

Figure 1:
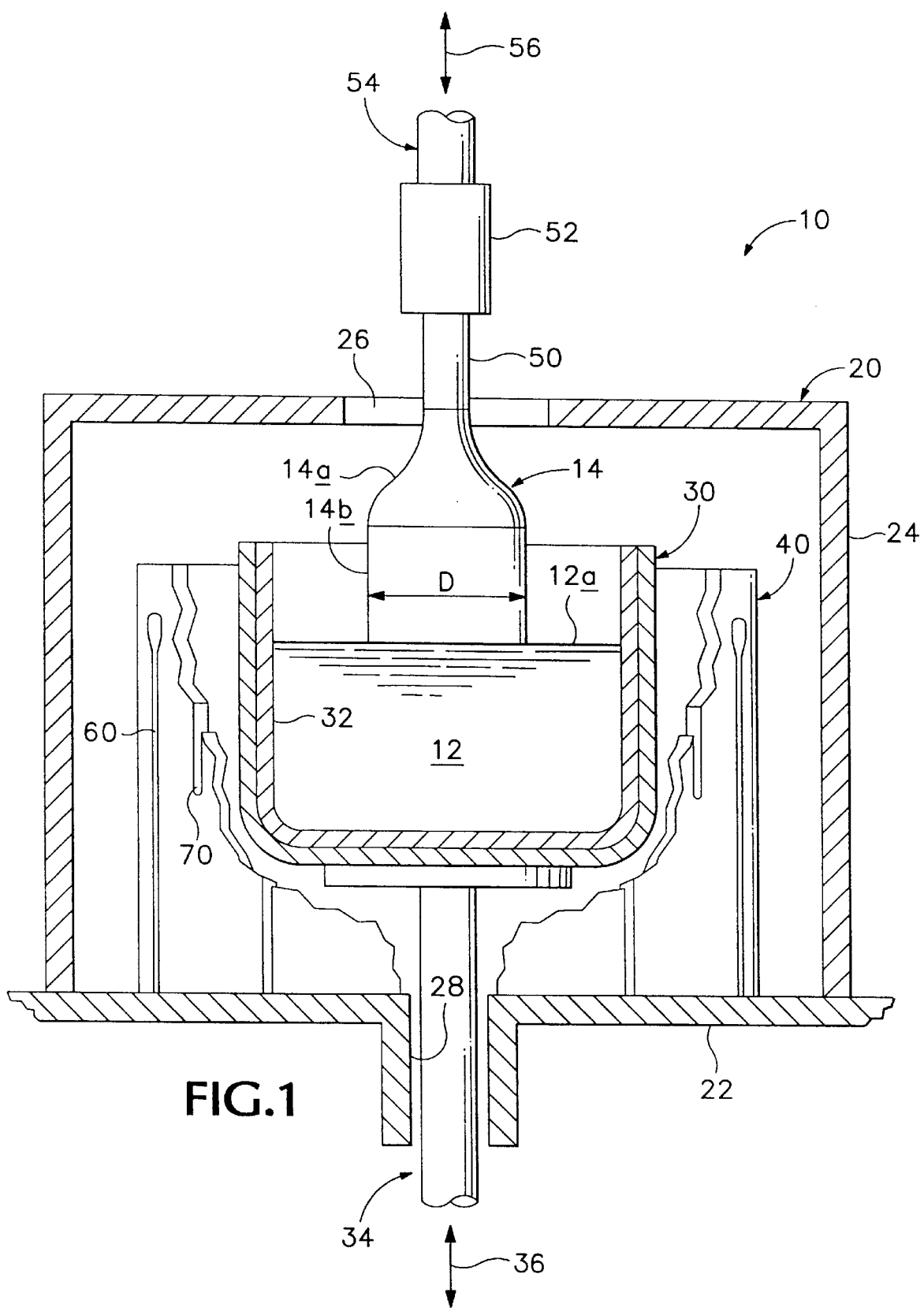
FIG. 1 is a somewhat schematic view of a system for use in growing crystals by the Czochralski method, the system employing a heater constructed in accordance with the present invention.

Referring initially to FIG. 1, a system for growing crystals by the Czochralski method is shown generally at 10, such system typically taking the form of a furnace adapted to heat semiconductor material 12 for use in growing a crystal such as that shown at 14. The semiconductor material may vary according to desired crystal characteristics, but typically will be molten silicon with included oxygen.

As indicated, the furnace includes a heat chamber 20 formed by a shelf 22 and a surrounding insulative structure 24. An upper opening 26 is defined in the insulative structure so as to provide for removal of a grown crystal. A lower opening 28 is defined in the shelf so as to provide for manipulation of the semiconductor material as will be described below.

Contained within the heat chamber is a crucible 30 which carries a quantity of semiconductor material, and a heater 40 which heats the semiconductor material to a molten state. The heater typically surrounds the crucible so as to uniformly heat the crucible, and the semiconductor material contained therein. Thereafter, a crystal may be drawn from the melt surface 12a of the molten semiconductor material, and removed from the heat chamber through opening 26.

As just indicated, a crystal is grown by introducing a seed 50 into molten semiconductor material, and very slowly withdrawing the seed so as to produce a single resultant crystal from the molten mass. The seed typically is held in a graphite chuck 52, which in turn is suspended from a holder 54 (which may take the form of a cable or shaft). The chuck firmly grips the seed so as to provide for generally vertical movement of the growing crystal as indicated by arrow 56.

In the depicted embodiment, crucible 30 includes a lining 32 made from a material such as quartz, providing a container which will not contaminate the molten semiconductor material under normal melt conditions. The crucible is supported on a shaft 34 which may be raised or lowered to reposition the crucible relative to the heater, typically along a generally vertical axis corresponding to arrow 36. The crucible thus may be adjusted such that melt surface 12a remains at a predetermined elevation within the heater, even as the amount of material within the crucible decreases.

Crystal diameter is determined at least in part by the temperature gradient of the system's heater, the diameter typically remaining relatively consistent after an initial growth period where the crystal is brought to its desired cross-sectional shape and size. FIG. 1, for example, shows a crystal 14 having a shoulder region 14a grown during the initial growth period, and a body region 14b grown subsequent to the initial growth period. As indicated, the crystal's diameter D is relatively uniform in body region 14b.

The crystal's size and shape also is affected by the power applied to the heater, which determines the temperature of the heat chamber in the vicinity of melt surface 12a. The depicted system thus typically provides for control of the crystal's size by adjustment of the power applied to heater 40.

In accordance with the present invention, heater 40 is configured to define a high temperature region, such region being adapted to draw oxygen away from a growing crystal by increasing the temperature at a position just above melt surface 12a. This shifts the heater's heat balance upwards, and effectively suppresses the natural melt convections of oxygen within the melt. Accordingly, the primary vehicle for transporting oxygen to the growing crystal is suppressed.

Figure 3:
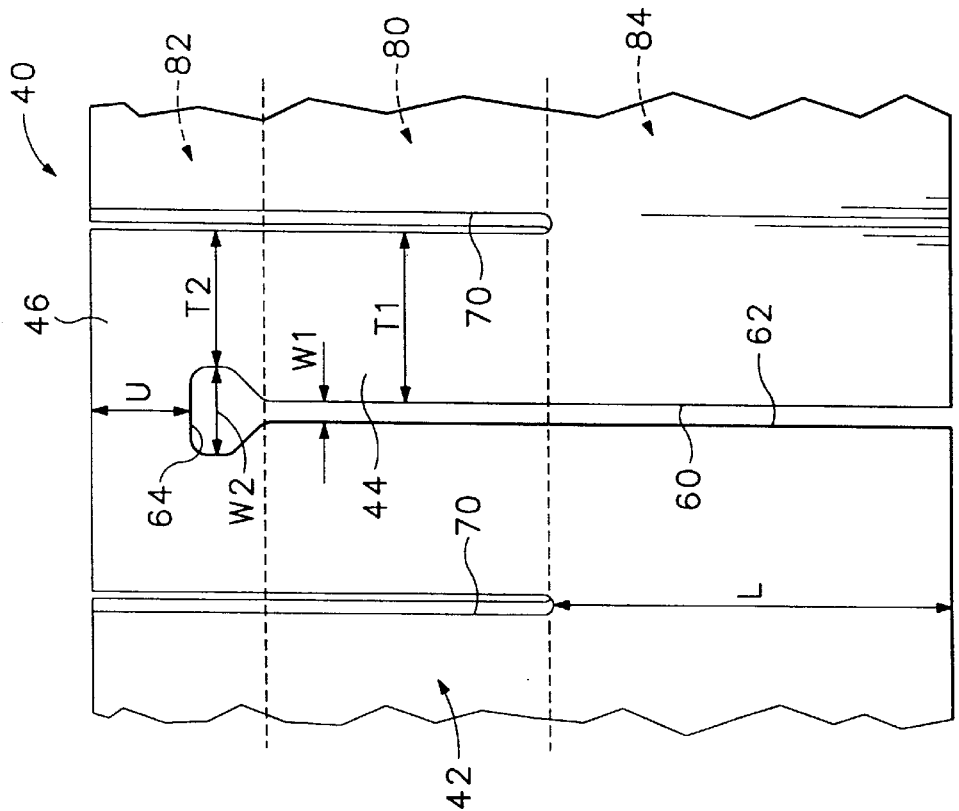
FIG. 3 is an enlarged fragmentary view of the heater shown in FIG. 1.
Figure 2:
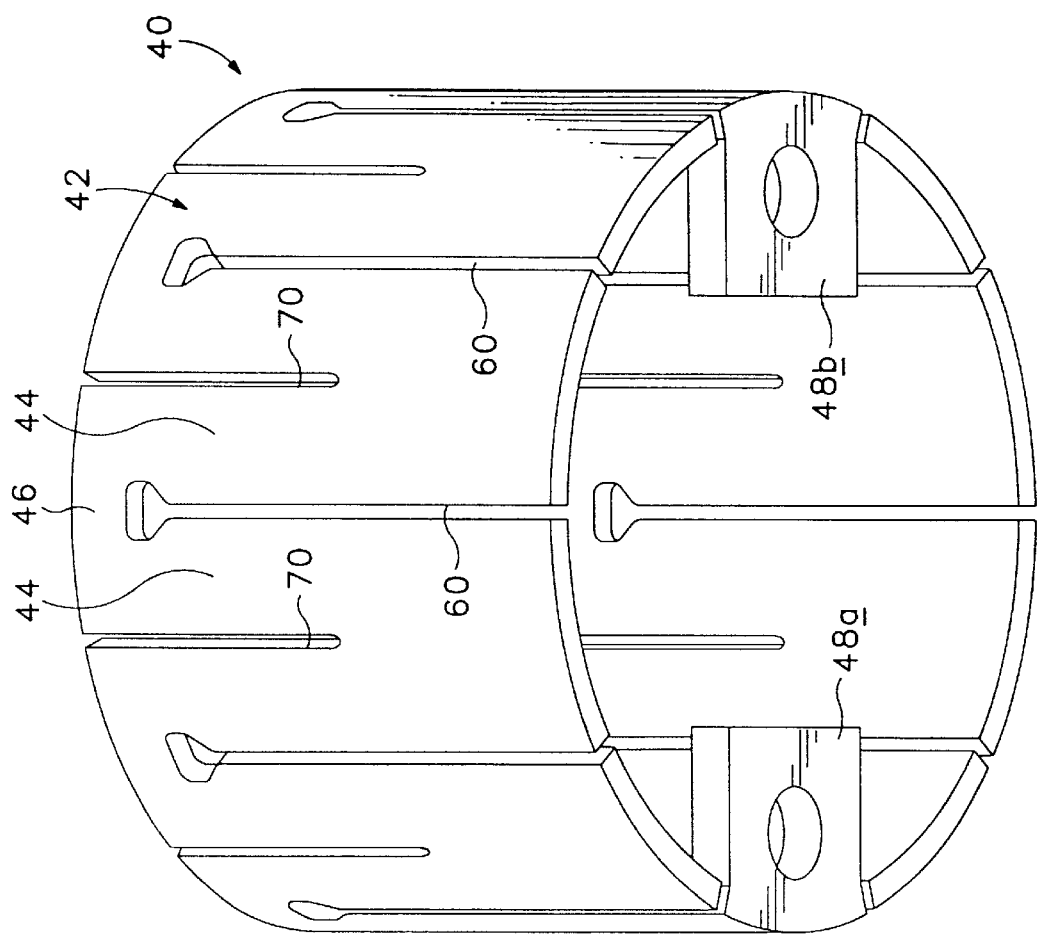
FIG. 2 is an isometric view of the heater shown in FIG. 1.

Referring now to FIGS. 2 and 3, it will be noted that heater 40 is in the form of a cylinder with a plurality of elongate longitudinal slots 60, 70. Slots 60 extend upwardly from a lower edge of the heater. Slots 70 extend downwardly from an upper edge of the heater. The upwardly-extending slots terminate at a distance U from the upper edge of the filter. The downwardly-extending slots terminate at a distance L from the lower edge of the filter. In the depicted embodiment, the upper distance U is approximately $1/7^{th}$ of the overall height of the heater. The lower distance L is approximately ½ of the overall height of the heater.

In accordance with the present invention, the slots are shaped to establish a predetermined heat characteristic of the heater, the width of each slot being at least in part determinative of the temperature of the heater upon application of a predetermined electrical potential. As indicated, slots 60 each include a body portion 62 of generally uniform width $W_1$, and a head portion 64 which widens to a width $W_2$. Slots 70 are of generally uniform width throughout, typically having a width approximately equal to the width $W_1$ of slots 60. In the depicted embodiment, width $W_1$ is approximately $1/5^{th}$ of width $W_2$.

Referring still to FIGS. 2 and 3, it will be noted that the heater may be considered in terms of a heating element in the form of an elongate conductive filament 42 having a rectangular cross sectional area which varies along its length. The filament typically takes the form of a flat carbon element folded back and forth on itself in an undulated pattern so as to define spaced, longitudinal pickets 44 connected by generally U-shaped return bends 46. In the depicted embodiment, the filament forms a closed loop having connectors 48a, 48b at equidistant points along the filament length. The depicted filament thus provides equal overall resistance across either span of filament between the connectors, and correspondingly, provides equal overall heat loss along either span of filament between the connectors upon application of power thereto.

One particularly beneficial feature of the invention involves the shape of the slots, which are configured both for operating efficiency and for long life. As indicated, the slots widen in an inverted teardrop shape. The inverted teardrop shape is defined by the slot's head portion, which is wider and somewhat arcuate near its upper end, and which narrows to a predetermined width equal to the width of the slot's body portion at or near its lower end. The filament thus will be seen to gradually narrow in the U-shaped return bends.

As will be appreciated by those skilled in the art, electrical resistance is inversely proportional to the cross sectional area of the filament, and the filament's heat loss is directly proportional to its resistance. Consequently, a narrow portion of the filament is subject to greater heat loss than a wider portion of the filament. Accordingly, both resistivity and heat loss vary along the length of filament 42. This may be considered either in terms of the thickness of the filament, or in terms of the width of the slots.

By using a teardrop-shaped head portion, it is possible to avoid sharp corners, and thus to effect a gradual change in cross sectional area of the filament along its length. This in turn provides for a gradual change in resistance, and correspondingly, a gradual change in temperature along the filament's length. The teardrop shape thus dissipates mechanical stress on the filament, establishes a relatively gradual change in resistance and temperature along the filament, and prolongs the heater's life.

The temperature gradient of the filament is not uniform due at least in part to variations in the cross sectional area of the filament along its length. It will be appreciated, for example, that the heater includes a first heater region 80 defined by a section of filament having a first cross sectional area, and a second heater region 82 defined by a section of filament having a second cross sectional area, less than the first cross sectional area. Although referred to as a second cross sectional area, it will be appreciated that the second cross sectional area varies throughout the return bends, but typically is less than the first cross sectional areas of the pickets.

This difference is illustrated in FIG. 3 by comparing the thickness $T_1$ (the thickness of the filament along picket 44) with thickness $T_2$ (the thickness of the filament in reverse bend 46). The filament's cross sectional area, it will be understood, is determined by multiplying its thickness by its depth. In FIG. 3, the thickness of filament 42 narrows in the second heater region defined by return bends 46. The depth remains relatively constant.

As indicated above, electrical resistance is inversely proportional to the filament's cross sectional area, and heat loss is directly proportional to electrical resistance. In the depicted embodiment, return bends 46 have a lesser cross sectional area than longitudinal pickets 44. Accordingly, the filament in the second heater region 82 has a higher resistance than the filament in the first heater region 80, and thus is subject to a greater heat loss.

The first heater region defines a heat zone. The second heater region defines an oxygen-reducing zone. Upon applying a predetermined electrical potential across the filament, the first heater region is heated to a first temperature, and the second heater region is heated to a second temperature which is greater than the first temperature. The melt surface 12a of the semiconductor material typically is at a level just below the second heater region (see FIG. 1). The second heater region thus may serve as a high temperature region whereby oxygen is reduced near the crystal.

A third heater region 84 is defined by a section of filament having a cross sectional area which is greater than either the first cross sectional area or the second cross sectional area. The third heater region 84 thus offers less resistance than either pickets 44 or return bends 46. Accordingly, the filament is subject to a heat loss in third heater region 84 that is less than either the heat loss in first heater region 80 or second heater region 82. This further shifts the beat balance upwards in the depicted heater.

Focusing now on longitudinal slots 60, 70, it will be noted that the width of the slots determine the thickness of the filament in the first heater region, the length and width of the slots deter mine the thickness of the filament in the second heater region, and the length alone determines the thickness of the filament in the third heater region. The slots are generally uniform within the first heater region, providing pickets of generally uniform cross sectional area, and thus generally uniform resistance along their lengths. Correspondingly, heat loss of each picket is generally uniform within the first heater region. However, the width of the slots widen in the second heater region, defining reverse bends with decreased cross sectional areas, thereby increasing resistance and heat loss.

With the foregoing in mind, it will be appreciated that a method for reducing oxygen in a growing crystal has been proposed. The method is useful in a crystal growing system wherein a seed is withdrawn from a molten material contained within a heat chamber having a heater with a first heater region substantially surrounding the molten material, and a second heater region adjacent the first heater region. The first heater region is heated to a first temperature so as to bring the material to a molten state. The second heater region is heated to a second temperature, greater than the first temperature, so as to suppress natural thermal melt convections of the material, and thereby reduce the oxygen content in the vicinity of the growing crystal.

While the present invention has been shown and described with reference to the foregoing operational principles and preferred embodiment, it will be apparent to those skilled in the art that other changes in form and detail may be made therein without departing from the spirit and scope of the invention as defined in the appended claims.

We claim:

1. A heater for use in heating a material from which a crystal is grown, the heater comprising:

a body formed from a conductive filament, the filament being configured to define a first heater region wherein the filament has a first resistance, and a second heater region wherein the filament has a second resistance greater than the first resistance;

the first heater region defining a heat zone wherein the material is melted, the first heater region being heated to a first temperature upon application of an electrical potential across the filament; and the second heater region defining a oxygen-reducing zone adjacent the heat zone, the second heater region being heated to a second temperature, greater than the first temperature, upon application of the electrical potential across the filament.

2. The heater of claim 1, wherein the filament has a first cross sectional area in the first heater region but lesser cross sectional area in the second heater region.

3. The heater of claim 1, wherein the filament defines a cylindrical body, the semiconductor material being contained within the heat zone of the cylindrical body.

4. The heater of claim 1, wherein the filament is folded back and forth on itself to define longitudinal filament pickets in the first heater region of the body and filament return bends in the second heater region of the body.

5. The heater of claim 4, wherein the longitudinal filament pickets have a first cross sectional area, and the filament return bends have a second cross sectional area less than the first cross sectional area.

6. The heater of claim 4, wherein the filament has a cross section which narrows in the filament return bends.

7. The heater of claim 4, wherein each filament return bend defines a generally teardrop-shaped opening.

8. A crystal growing system for use in growing a crystal from a material, the system comprising:

a conductive filament configured to heat material within the heat chamber, the filament defining one or more slots, selected slots having a first slot portion of a width to define a first heater region wherein the filament has a first resistance, and a second slot portion wherein the slot widens to define a second heater region wherein the filament has a second resistance greater than the first resistance, the second heater region thus being hotter than the first heater region upon application of an electrical potential across the filament; and a holder movably mounted within the heat chamber to selectively draw a growing crystal from the material.

9. The crystal growing system of claim 8, wherein the filament has a cross section which narrows in the second heater region.

10. The crystal growing system of claim 8, wherein the second slot portion of each selected slot defines a generally teardrop-shaped opening.

11. The crystal growing system of claim 8, wherein the filament defines a cylindrical body which surrounds the material, the cylindrical body having slots which extend from opposite ends of the body to define pickets in a first heater region of the body and return bends in a second heater region and a third heater region of the body.

12. The crystal growing system of claim 11, wherein the pickets in the first heater region of the body have a first cross sectional area, and the return bends in the second heater region of the body have a second cross sectional area less than the first cross sectional area.

13. The crystal growing system of claim 12, wherein the return bends in the third heater region of the body have third cross sectional areas greater than the first cross sectional area.

14. A heater used in heating material held within a crucible, the material defining a melt surface from which a crystal is grown, the heater comprising:

a cylindrical body having longitudinal slots which extend from opposite ends of the body to define a filament with longitudinal pickets in a central region of the body and return bends in opposite end regions of the body, slots which extend from a selected end of the body having a first slot portion of a width to define a first heater region wherein the heater has a first heat characteristic and having a second slot portion of generally teardrop shape to define a second heater region wherein the heater has a second heat characteristic, the second heater region being hotter than the first heater region upon application of an electrical potential across the filament.

15. The heater of claim 14, wherein slots which extend from the selected end of the body are longer than slots which extend from an opposite end of the body.

16. The heater of claim 15, wherein the crucible is contained within the central region of the body for growth of a crystal toward the opposite end of the body.

* * * * *